United States Patent
Simmons et al.

(10) Patent No.: US 7,091,723 B2
(45) Date of Patent: Aug. 15, 2006

(54) AFCI CIRCUIT TEST MODULE

(76) Inventors: Michael Lee Simmons, 6315 Betsy Ross Ct., Centreville, VA (US) 20121; David F. Groene, 14205 Essex Dr., Woodbridge, VA (US) 22192

( * ) Notice: Subject to any disclaimer, the term of this patent is extended or adjusted under 35 U.S.C. 154(b) by 0 days.

(21) Appl. No.: 10/985,976

(22) Filed: Nov. 12, 2004

(65) Prior Publication Data

US 2006/0103390 A1    May 18, 2006

(51) Int. Cl.
*G01R 31/00* (2006.01)
(52) U.S. Cl. ...................................................... 324/508
(58) Field of Classification Search ............... 324/536, 324/509, 508, 537, 415, 424, 73.1
See application file for complete search history.

(56) References Cited

U.S. PATENT DOCUMENTS

| | | | |
|---|---|---|---|
| 5,459,630 A | 10/1995 | MacKenzie et al. | |
| 6,191,589 B1 | 2/2001 | Clunn | |
| 6,309,248 B1* | 10/2001 | King | 439/535 |
| 6,339,525 B1 | 1/2002 | Neiger et al. | |
| 6,407,893 B1 | 6/2002 | Neiger et al. | |
| 6,426,632 B1 | 7/2002 | Clunn | |
| 6,433,977 B1 | 8/2002 | Macbeth | |
| 6,462,555 B1 | 10/2002 | Schaefer | |
| 2002/0063565 A1 | 5/2002 | Stroth | |
| 2003/0169545 A1 | 9/2003 | Tallman et al. | |
| 2004/0174173 A1* | 9/2004 | Elms et al. | 324/509 |

* cited by examiner

*Primary Examiner*—Vincent Q. Nguyen
(74) *Attorney, Agent, or Firm*—Diederiks & Whitelaw, PLC

(57) ABSTRACT

An arc fault circuit interrupter (AFCI) module includes a plug portion, a probe receiving portion and an AFCI test actuator for initiating a test of an AFCI protected circuit. More specifically, the plug portion includes a plurality of prongs configured to matingly engage with a standard three-prong receptacle. With this construction, upon engaging the plug portion with a AFCI protected receptacle, manipulation of the AFCI test actuator will cause a properly operating AFCI device to trip, i.e., terminate power to the AFCI protected receptacle. The module can also be provided with an AFCI circuit. The module can then be employed to protect an electrical device that is plugged into an unprotected circuit. The probe receiving portion is adapted to interconnect and expand the testing capabilities of a standard receptacle tester or, alternatively, be interconnected with various test probes associated with standard voltage testers.

23 Claims, 4 Drawing Sheets

AFCI CIRCUIT TEST MODULE

BACKGROUND OF THE INVENTION

1. Field of the Invention

The present invention pertains to the art of electrical circuit testers and, more particularly, to an electrical circuit test module which interfaces with a standard electrical circuit tester to test arc fault circuit interrupter (AFCI) protected circuits.

2. Discussion of the Prior Art

Electrical receptacles are found throughout households and commercial locations. Actually, every room in a household or commercial location is provided with multiple receptacles so as to minimize the need for extension cords and adapters that enable multiple loads to be run through a single receptacle. During installation, the receptacles must be tested to ensure proper wiring and grounding. More specifically, in order to meet local and national code requirements, each receptacle must have the proper polarity and must be properly grounded. To test for proper wiring, an electrician will employ a testing device to ascertain if the receptacle is wired correctly. The testing device can range anywhere from a simple receptacle tester, such as Model # 61-500 made by the IDEAL® Company, to more expensive multi-testers, both digital and analog, used in electronic testing.

In addition to standard, three-prong receptacles, the National Electric Code requires that certain locations, such as in outdoor applications, kitchens, bathrooms and the like, be protected by a ground fault circuit interrupter (GFCI) circuit breaker or receptacle. While all circuits are protected against over current conditions by fuses or circuit breakers, standard fuses and circuit breakers will not protect against a ground leak. The GFCI breaker/receptacle will cut off power to a load in the event a predetermined current level passes between a neutral conductor and ground. The GFCI protects the consumer from electrocution in the event of a ground leak, as a leak of this type will generally not trigger a standard circuit breaker.

Unlike standard receptacles, a GFCI breaker/receptacle includes a test button used to check the functionality of the GFCI. However, the test button is only an indication of functionality, i.e., no actual load is placed on the circuit. Therefore, to properly test a GFCI breaker/receptacle, a special testing device is required. Like the testing device for standard receptacles, the special GFCI testing device can range from a durable inexpensive model, such as IDEAL® E-Z Check® model # 61-051 to a more expensive, branch circuit tester, such as IDEAL® model # 61-154. Regardless of the particular model employed, each of these devices function by simulating an actual current leak to test the GFCI protected receptacle.

As described above, a traditional circuit breaker protects against an over current condition that exceeds a particular rating for the circuit breaker. One form of over current condition occurs as a result of hazardous arcing. When arcing occurs at current levels above which the circuit breaker is rated, the circuit breaker cuts off electricity to an affected receptacle or branch circuit. However, a traditional circuit breaker will not shut down power to a receptacle where arcing occurs at current levels below which the circuit breaker is rated.

Electrical arcing, whether at low or high levels, results in the production of heat. Arc faults can generally go undetected for an extended time, while generating temperatures as high as approximately 5000° F. (2760° C.) at low current levels. If left unchecked, the heat could cause a fire. In order to ensure that electricity is shut down to a receptacle experiencing low level arcing, an arc fault circuit interrupter (AFCI) must be employed. The National Electric Code now requires that all receptacles located in bedrooms be protected by an AFCI circuit breaker or receptacle. In a manner similar to that described above with respect to GFCI receptacles, an AFCI receptacle includes a test button that trips the AFCI function. However, also like the GFCI breaker/receptacle, the test is just an indication of functionality. No load is applied to the circuit. Therefore, a special test device is required to properly test the functionality of the AFCI device.

At present, testing devices capable of checking the performance of an AFCI protected circuit are either combined into other, more expensive, testing devices or are embodied in a tester much like the GFCI circuit/receptacle tester described above. At this point, many professionals have already invested in equipment for testing receptacles, GFCI protected circuits and the like. Without a tester capable of interfacing and expanding the capability of existing equipment, most professionals will be forced to invest in additional, more expensive equipment or carry additional, sometimes duplicative testers. Based on the above, there still exists a need for a need for a durable, low cost AFCI testing device capable of interfacing with existing circuit testing equipment, thereby enabling an electrician to adapt equipment designed for only testing GFCI protected circuits to also test AFCI protected circuits.

SUMMARY OF THE INVENTION

The present invention is directed to an arc fault circuit interrupter (AFCI) tester. In accordance with a preferred embodiment of the invention, the AFCI circuit tester includes a plug portion, a probe receiving portion and an AFCI test actuator for initiating a test of an AFCI protected circuit. More specifically, the plug portion includes a plurality of prongs configured to matingly engage with a standard three-prong electrical receptacle. With this construction, after inserting the plug portion into an AFCI protected receptacle, manipulation of the AFCI test actuator will cause a properly operating AFCI device to trip, i.e., terminate, or cut-off, power to the AFCI protected receptacle, as well as other receptacles that may be connected down line of the protected receptacle.

In accordance with one aspect of the present invention, the probe receiving portion includes a plurality of openings adapted to mate with a receptacle tester. That is, the plurality of openings correspond to a plurality of electrodes associated with the receptacle tester. In this manner, the capability of a standard GFCI receptacle tester can be expanded for use in testing AFCI protected devices by mating with the AFCI tester. In accordance with another aspect of the present invention, the AFCI testing device can be built into an extension cord. More specifically, the plug portion and probe receiving portion are separated by a cable having a plurality of electrical conductors. This configuration enables the AFCI tester to interface with various circuit testers available on the market. In accordance with a still further aspect of the invention, the AFCI tester is also provided with arc detection circuitry. With this construction, a consumer can plug the tester in an otherwise unprotected circuit to provide arc protection for various household electrical devices.

Additional objects, features and advantages of the present invention will become more readily apparent from the following detailed description of preferred embodiments

DETAILED DESCRIPTION OF THE PREFERRED EMBODIMENTS

Figure 1:
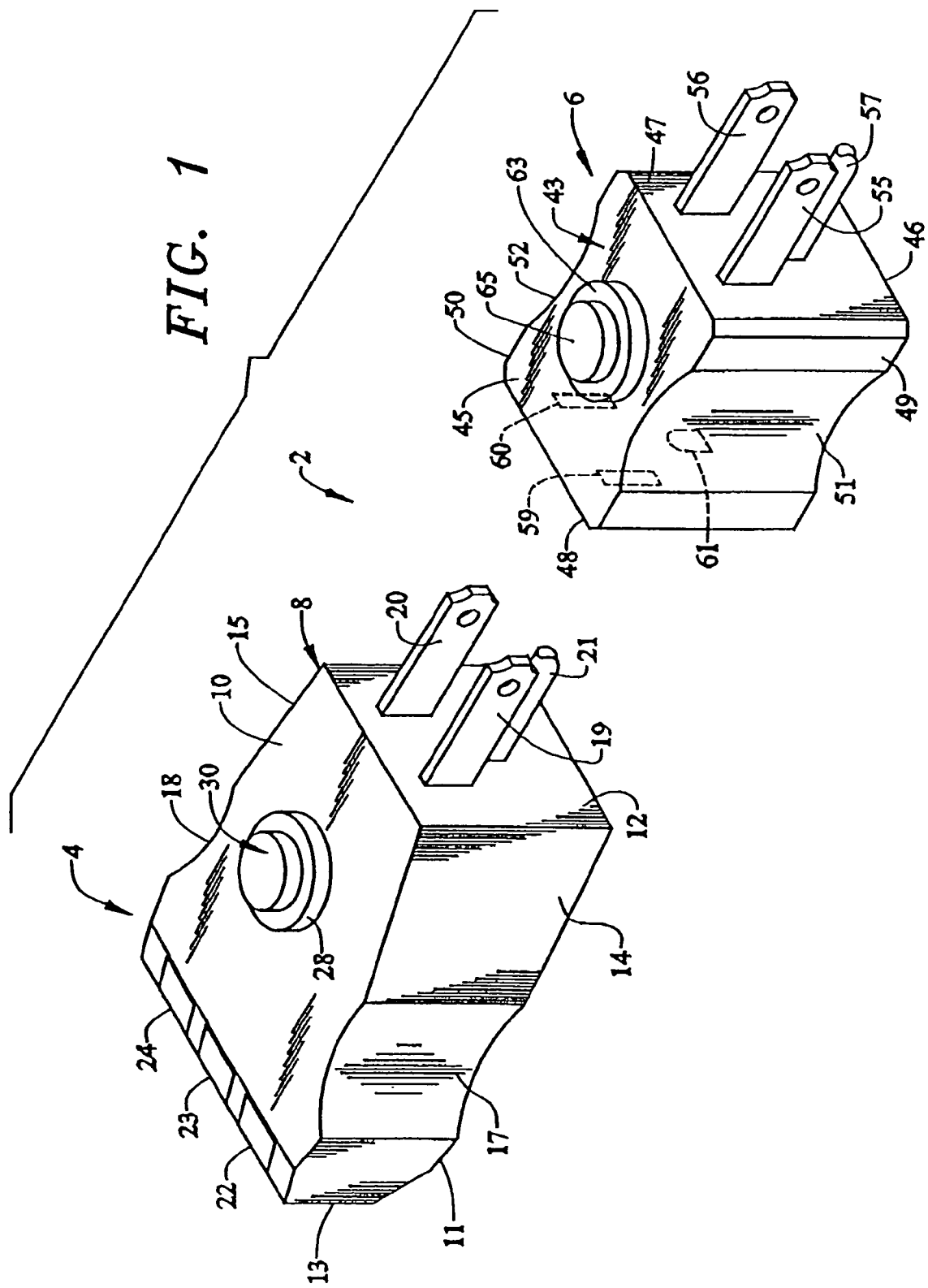
FIG. 1 is an exploded view of arc fault circuit interrupter (AFCI) circuit tester adapter constructed in accordance with a preferred embodiment of the present invention in combination with a GFCI receptacle tester.
Figure 2:
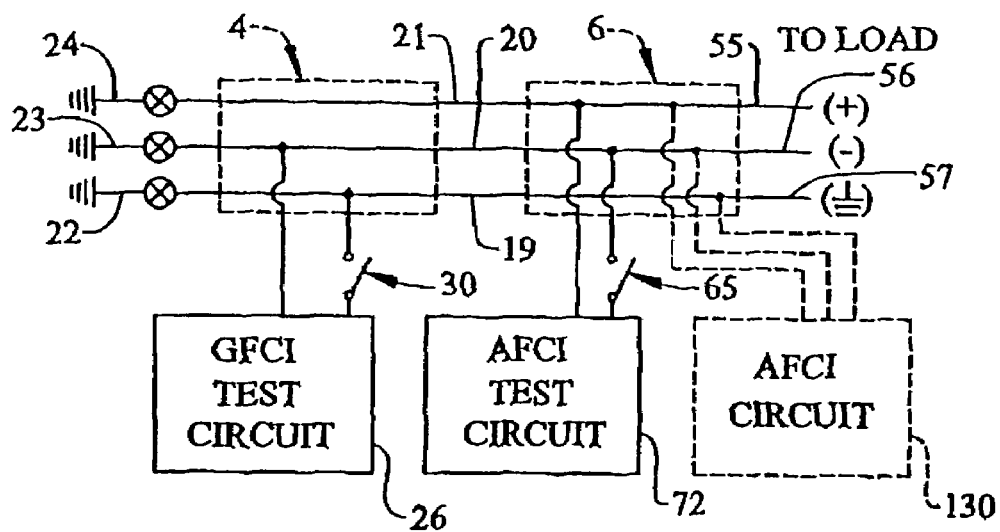
FIG. 2 schematically illustrates an electrical interrelationship between the AFCI circuit tester adaptor and GFCI receptacle tester of FIG. 1.

With initial reference to FIGS. 1 and 2, an electrical circuit test device constructed in accordance with the present invention is generally indicated at 2. Specifically, electrical circuit test device 2 includes a circuit tester portion 4 which, in the embodiment shown, is a receptacle tester. However, it should be understood that circuit tester portion 4 of the present invention could include other forms of circuit testers, e.g., digital and analog multimeters, solenoid-type voltage/continuity testers, and the like. Electrical circuit test device 2 also includes an adapter module 6 used to enhance the overall capabilities of circuit tester portion 4 to include testing of arc fault circuit interrupters (AFCI) now required by the National Electrical Code to be incorporated into all electrical receptacles located in residential bedrooms.

In a manner known in the art, circuit tester portion 4 includes a main body portion or housing 8 having top, bottom, front, rear and opposing side wall portions 10–15. Side wall portions 14 and 15 include respective gripping regions 17 and 18 that facilitate the manual insertion and removal of circuit tester portion 4 into an electrical receptacle (not shown). Toward that end, circuit tester portion 4 is provided with a plurality of prongs 19–21 that project from front wall portion 12. In a manner also known in the art, arranged on rear wall portion 13 are a plurality of indicator lights 22–24 that, when circuit tester portion 4 is inserted into an associated electrical outlet, provide an indication as to the connectivity of the electrical receptacle. More specifically, indicator lights 22–24 provide an indication of circuit polarity and proper grounding. In the embodiment shown, circuit tester portion 4 is actually a ground fault circuit interrupter (GFCI) circuit tester. That is, circuit tester portion 4 is provided with internal circuitry 26 (see FIG. 2) that enables an individual to test the operability of a GFCI protected circuit. Toward that end, arranged on top wall portion 10 is a circular raised area 28 within which is positioned a GFCI test actuator 30. In the embodiment shown, test actuator 30 is constituted by a momentary button, however other types of circuit closing elements are also acceptable. Thus, once circuit tester portion 4 is inserted into a GFCI protected outlet, activation of test actuator 30 will cause a properly operating GFCI protected receptacle to trip, cutting off power to the particular circuit(s) protected by the GFCI.

In general, circuit tester portion 4 described above is known in the art. The present invention is particularly directed to adapter module 6 and, more particularly, to the interrelationship between adapter module 6 and other circuit testers, including circuit tester portion 4. In accordance with a preferred form of the present invention, adapter module 6 includes a main body portion 43 constituted by top, bottom, front or plug rear or probe receiving, and side portions 45–50 respectively. Side portions 49 and 50 are provided with respective gripping zones 51 and 52 used to aid in manually inserting adapter module 6 onto circuit tester 4 or into a AFCI protected receptacle (not shown). Toward that end, adapter module 6 is provided with a plurality of electrodes 55–57 arranged in such a manner as to be capable of interengaging with a standard three prong electrical outlet (not shown). Adapter module 6 is also provided with a plurality of openings 59–61 arranged about rear wall portion 48. Openings 59–61 are arranged so as to matingly receive, for example, prongs 19–21 of circuit tester portion 4 respectively. In any event, openings 59–61 are arranged in a standard three-prong plug configuration. With this overall construction, adapter module 6 is interconnected with a circuit tester, such as circuit tester portion 4, to expand the overall capabilities of circuit tester portion 4.

In further accordance with invention, adapter module 6 is constituted by an arc fault circuit interrupter (AFCI) testing device. That is, when adapter module 6 is inserted into an AFCI protected receptacle, an electrician or other individual can test the functionality of an AFCI protected circuit in a manner similar to that described above with respect to circuit tester portion 4 when testing a GFCI protected circuit. That is, arranged on top wall 45 of adapter module 6 is a raised portion 63 having arranged therein an AFCI test actuator 65. More specifically, after the plurality of electrodes 55–57 are inserted into an AFCI protected receptacle, activation of test actuator 65 initiates an AFCI test circuit 72 (see FIG. 2) that tests the functionality of the AFCI protected receptacle.

AFCI adapter module 6 is primarily concerned with expanding the test capabilities of existing circuit testers, for example, circuit tester portion 4. Thus, once prongs 19–21 are inserted into openings 59–61, a current path is established between electrodes 55–57 of adapter module 6 and circuit tester portion 4 (see FIG. 2). Actually, each of openings 59–61 leads to an associated terminal that electrically interconnects circuit tester portion 4 with AFCI adapter module 6. Thus, an electrician or other individual need only insert the combined electrical circuit test device 2 into a receptacle to test for particular circuit parameters. More specifically, as circuit tester portion 4 includes GFCI test circuit 26, inserting electrodes 55–57 into a GFCI protected outlet enables an electrician or other individual to test the operability of the GFCI protected outlet by activating test actuator 30. To test the operability of an AFCI protected outlet, electrodes 55–57 are inserted into an AFCI protected receptacle and AFCI test actuator 65 is activated to initiate AFCI test circuit 72 that, as described above, will cause a properly operating AFCI protected receptacle to trip. Furthermore, electrical circuit test device 2 can test standard, unprotected outlets by simply inserting electrodes 55–57 into a standard outlet and reading indicator lights 22–24 to check circuit polarity and for a proper ground. In this manner, an electrician can expand the overall functionality of a standard GFCI circuit tester to test not only GFCI protected circuits but AFCI protected circuits as well as standard receptacles. In addition, while AFCI adapter module 6 can be used by itself, combining AFCI adapter module 6 with a GFCI tester allows an electrician to test a broader array of circuits without requiring reconfiguration of the GFCI tester or the use of multiple testing devices.

Figure 3:
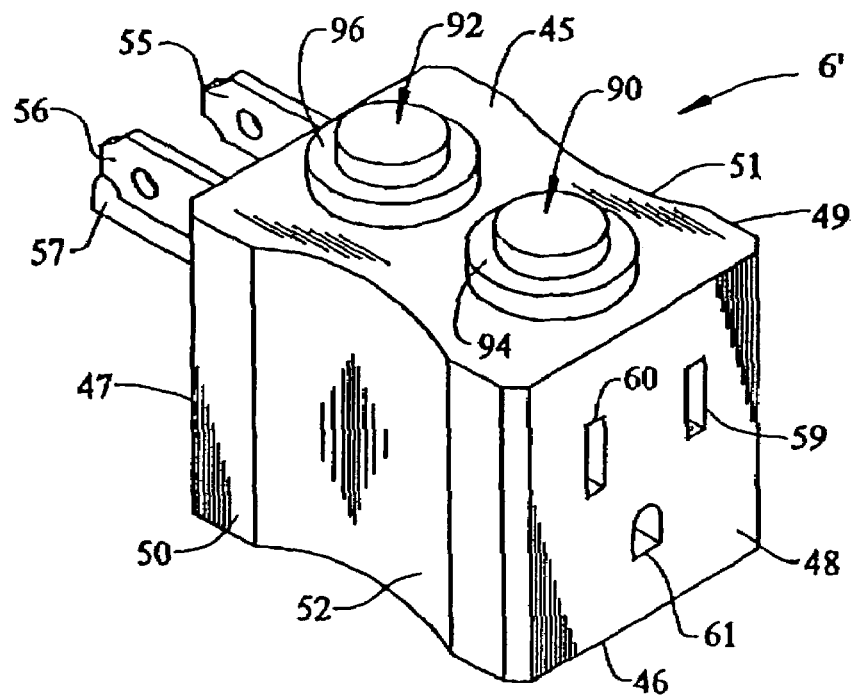
FIG. 3 is a perspective view of an AFCI circuit tester adapter including GFCI circuit testing capabilities constructed in accordance with a second embodiment of the present invention.

Referring to FIG. 3 wherein like reference numerals represent corresponding parts to that described above, an adapter module 6' constructed in accordance with a second embodiment of the present invention is shown to include both a GFCI testing capability, as well as an AFCI testing capability, in a single unit. More specifically, arranged on top wall portion 45 is a GFCI test actuator button 90 and a AFCI test actuator button 92 each positioned in respective raised portions 94 and 96. Thus, adapter module 6' can be interconnected with a standard circuit tester portion 4 to expand the overall testing capabilities to include testing both GFCI protected circuits and AFCI protected circuits. In accordance with one aspect of the invention, adapter module 6' is provided with AFCI circuit testing capabilities, as well as arc protection circuitry such as indicated in phantom at 130 in FIG. 2. In this manner, adapter module 6' is not only capable of testing protected circuits, but providing ARC protection to unprotected circuits. That is, in the event that a consumer desires arc protection on an otherwise unprotected household circuit, instead of replacing a circuit breaker, adapter module 6' is simply inserted into an outlet. An electrical device can then be plugged into openings 59–61 and be afforded arc protection though adapter module 6'. Moreover, as shown in FIG. 4, because openings 59–61 lead to terminals (not shown) that are electrically interconnected with electrodes 55–57, an electrician or other individual may use a standard, or solenoid-type circuit tester 150 to determine the particular circuit parameters of a circuit, as well as a circuit having AFCI or GFCI protection without the requirement for circuit tester portion 4.

Figure 4:
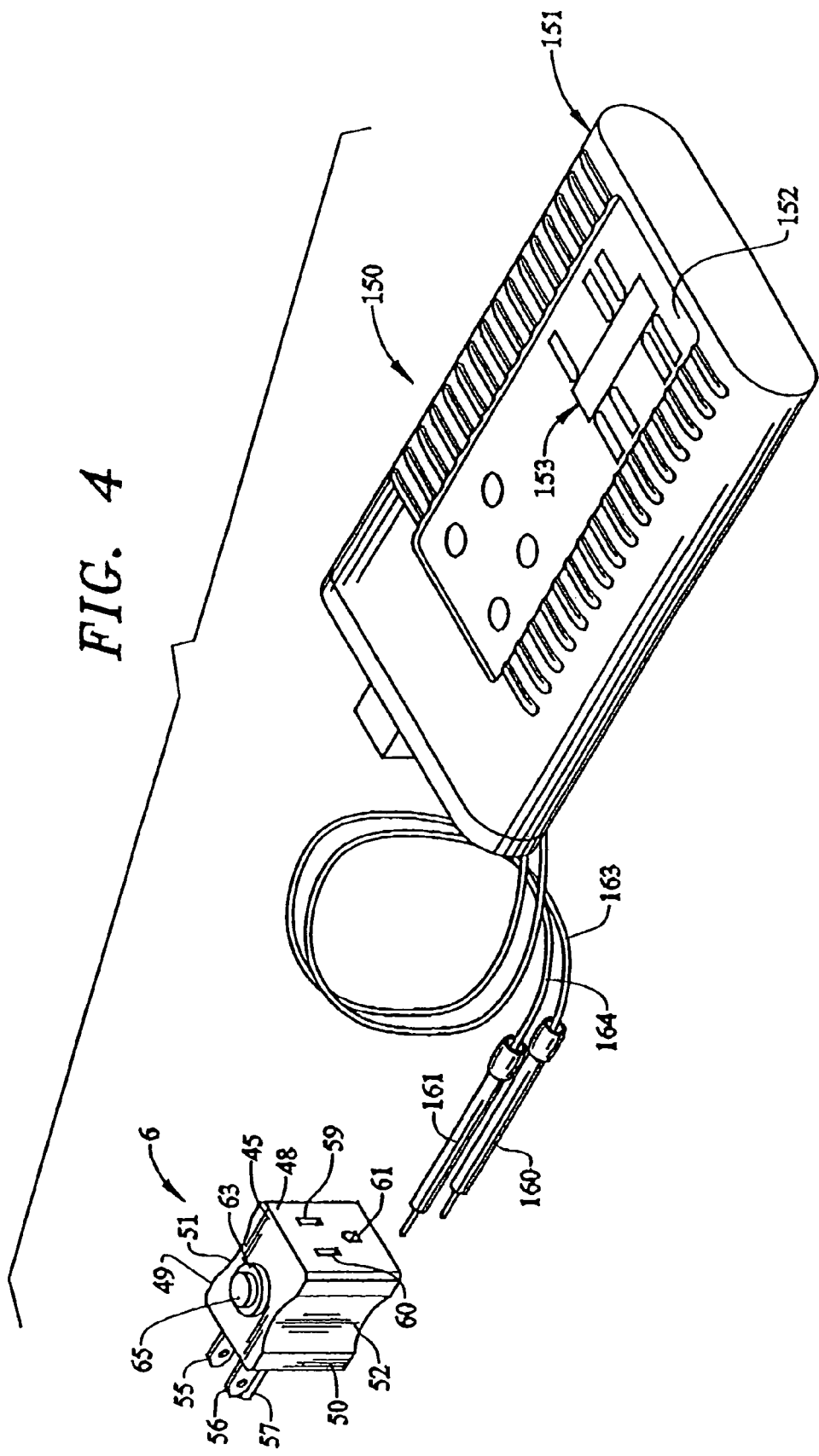
FIG. 4 illustrates the AFCI circuit tester adapter of FIG. 1 in conjunction with a solenoid-type circuit tester.

As best shown in FIG. 4, solenoid-type circuit tester 150 includes a main body portion 151 having a display zone 152 including a display window 153. In addition, solenoid-type circuit tester 150 includes first and second probes 160, 161 that are interconnected to main body portion 151 through a pair of associated leads 163, 164. Thus, in the event an electrician or other individual is without a particular circuit tester portion 4, adapter module 6 may be placed into, for example an AFCI protected receptacle, with probes 160 and 161 being inserted into openings 59–61 to determine various circuit parameters of the receptacle. In addition, test actuator button 65 can be depressed to test the functionality of the AFCI protected circuit.

Figure 5:
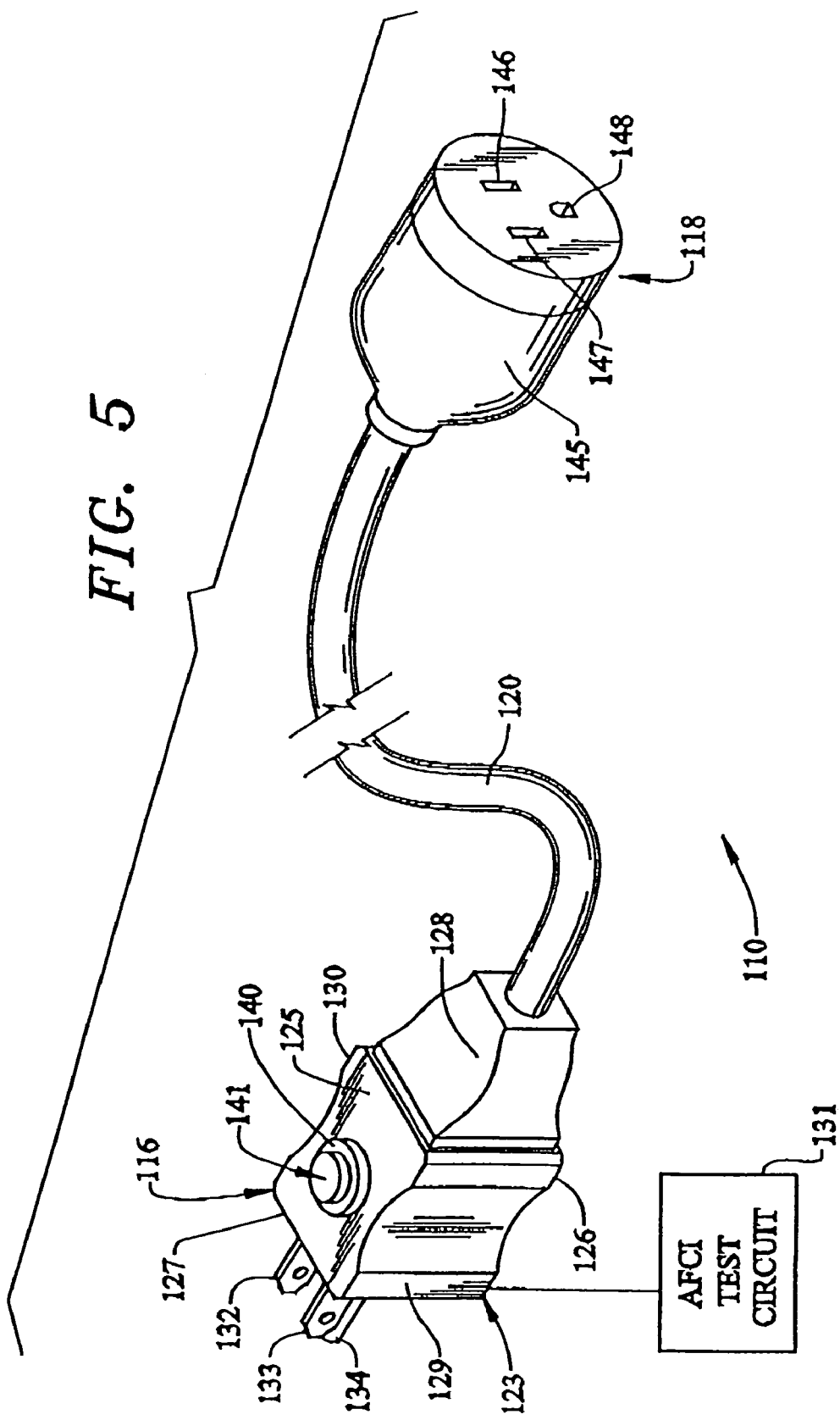
FIG. 5 depicts a AFCI circuit tester adapter incorporated into an extension cord in accordance with a third embodiment of the present invention.

Reference will now be made to FIG. 5 in describing an adapter module 110 constructed in accordance with a third embodiment of the present invention. Adapter module 110 includes a first or test portion 116 that leads to a connector end portion 118 through a cord or cable 120. Cable 120 includes a plurality of electrical conductors (not shown) that electrically interconnect test portion 116 and connector end portion 118. In accordance with the embodiment shown, test portion 116 includes a main body housing 123 including top, bottom, front, rear and side wall portions 125–130. Test portion 116 houses an AFCI test circuit 131 and is adapted to be inserted into a standard three-prong outlet in a manner similar to that described above. Thus, arranged on front portion 127 are a plurality of electrodes 132–134 configured in such a manner as to correspond to a standard three prong electrical outlet (not shown). Adapter module 110 is adapted to perform tests on AFCI protected circuits. Thus, arranged on top wall portion 125 is a raised area 140 that surrounds an AFCI test actuator button 141 which, in a manner described above, when depressed, activates test circuit 131 to cause a properly functioning an AFCI protected circuit to trip and cut off electrical power to the receptacle(s) protected by the AFCI device. Adapter module 110 is actually designed to interconnect with various types of electrical circuit testers (not shown) having electrodes arranged within a test device housing (not shown). Thus, connector end 118 is actually constituted by a plug portion 145 including a plurality of openings 146–148 within which are arranged electrodes (not shown) adapted to electrically interconnect test portion 116 with an electrical testing device.

Several testing devices include a housing having electrodes located therein, an example of which includes the Ideal® Sure Test® circuit analyzer. That is, testing devices having this particular configuration require various adapter cords to interconnect the testing device with a given receptacle configuration. While several models include provisions for digitally analyzing circuits, and testing both AFCI and GFCI protected circuits, standard models are not provided with these particular capabilities. Thus, a professional would either be forced to purchase another costly testing device, or an adapter cord that could expand the testing capabilities of his/her existing tester. Thus, the present invention enables electricians, consumers and other professionals to test the functionality of AFCI circuits without the need for more costly test equipment, or to carry multiple, individual use, testing devices for testing a variety of circuit types.

Although described with reference to preferred embodiments of the present invention, it should be readily apparent to one of ordinary skill in the art that various changes and/or modifications can be made to the invention without departing from the spirit thereof. For instance, the particular configuration of the test module is presented for exemplary purposes and should not be construed as limiting. In addition, while there are several circuit testers described as interfacing with the test module of the present invention, there exists a wide array of other circuit and electrical testers that could also be employed. Furthermore, the configuration of the prongs/electrodes is but one example. Other examples could include 220 Volt receptacle configurations, as well as configurations used in Europe and other parts of the world. Finally, the particular connectors of indicators in FIG. 2, more specifically, the wiring of indicator lights 22–24 and test buttons 30 and 65 is for exemplary purposes only. It should be understood that additional connectors and elements have been removed to provide a better understanding of the drawings. In general, the invention is only intended to be limited to the scope of the following claims.

We claim:

1. An electrical circuit testing device comprising:
   a primary circuit tester including a main housing having a first end including a plurality of electrodes and a second end having a display member, wherein said plurality of electrodes are adapted to matingly engage with a standard household receptacle with said display member providing information relating to parameters associated with the standard household receptacle; and
   an AFCI circuit test module including a main body portion, a plug portion having a plurality of prongs adapted to matingly engage with a standard three-prong receptacle, a probe receiving portion including a plurality of openings formed in the main body portion for receiving and electrically interconnecting the plurality of electrodes of the primary circuit tester with the plug portion of the AFCI circuit test module, an AFCI test circuit for testing AFCI protected circuits, an AFCI circuit provided in the main body portion for providing arc fault protection to an unprotected electrical circuit, and an AFCI test actuator provided on the main body portion for initiating a test of an AFCI protected circuit wherein, upon engaging the plug portion with an AFCI protected receptacle, activation of the AFCI test actuator tests the operation of the AFCI protected circuit through the AFCI test circuit.

2. The electrical circuit testing device according to claim 1, wherein the primary circuit tester includes a GFCI test circuit for testing an operational capacity of a GFCI protected circuit.

3. The electrical circuit testing device according to claim 1, wherein the primary circuit tester is a receptacle tester.

4. The electrical circuit testing device according to claim 1, wherein the primary circuit tester is a solenoid-type voltage tester.

5. An AFCI circuit test module comprising:
a main body portion;
a plug portion having a plurality of prongs adapted to matingly engage with a standard three-prong receptacle;
a probe receiving portion including a plurality of openings formed in the main body portion, said openings being adapted to receive and electrically interconnect a circuit tester with the plug portion;
an AFCI test circuit for testing AFCI protected circuits; and
an AFCI test actuator provided on the main body portion for initiating a test of an AFCI protected circuit wherein, upon engaging the plug end with an AFCI protected receptacle, activation of the AFCI test actuator tests the operation of the AFCI protected receptacle through the AFCI test circuit.

6. The AFCI circuit test module according to claim 5, further comprising: a GFCI test actuator provided on the main body portion, said GFCI test actuator being used in testing an operational capacity of a GFCI protected circuit.

7. The AFCI circuit test module according to claim 5, wherein the probe receiving portion includes three openings formed in the main body portion, said three openings being adapted to receive a plurality of electrodes arranged in a standard three-prong receptacle configuration to electrically interconnect the plurality of electrodes with the plug portion of the AFCI circuit tester.

8. The AFCI circuit test module according to claim 7, further comprising: a circuit testing device, said probe receiving portion being adapted to receive and electrically interconnect with the circuit testing device.

9. The AFCI circuit test module according to claim 8, wherein the circuit testing device is a receptacle tester.

10. The AFCI circuit test module according to claim 8, wherein the circuit testing device is a solenoid voltage tester.

11. The AFCI circuit test module according to claim 5, wherein the main body portion includes an electrical cable that separates and electrically interconnects the plug portion with the probe receiving portion.

12. The AFCI circuit test module according to claim 11, wherein the AFCI test actuator is positioned at the plug portion.

13. An AFCI circuit test module comprising:
a main body portion;
plug means provided on the main body portion for engaging with a standard three-prong receptacle;
probe receiving means formed in the main body portion for receiving and electrically interconnecting a circuit tester with the plug means; and
an AFCI test means carried by the main body portion for initiating a test of an AFCI protected circuit, wherein upon engaging the plug means with an AFCI protected receptacle, activation of the AFCI test means tests the operational capacity of the AFCI protected receptacle.

14. The AFCI circuit test module according to claim 13, further comprising: a GFCI test means carried by the main body portion, said GFCI test means being used in testing an operational capacity of a GFCI protected circuit.

15. The AFCI circuit test module according to claim 13, wherein the probe receiving means is constituted by three openings formed in the main body portion, said three openings being adapted to receive a plurality of electrodes arranged in a standard three-prong receptacle configuration to electrically interconnect the plurality of electrodes with the plug means of the AFCI circuit tester.

16. The AFCI circuit test module according to claim 15, further comprising: a circuit testing device, said probe receiving means receiving and electrically interconnecting with the circuit testing device.

17. The AFCI circuit test module according to claim 16, wherein the circuit testing device is a receptacle tester.

18. The AFCI circuit test module according to claim 16, wherein the circuit testing device is a solenoid voltage tester.

19. The AFCI circuit test module according to claim 13, wherein the main body portion includes an electrical cable separating and electrically interconnecting the plug means and the probe receiving means.

20. The AFCI circuit test module according to claim 19, wherein the FCI test means is positioned at the plug means.

21. An AFCI circuit module comprising:
a main body portion;
a plug portion having a plurality of prongs adapted to matingly engage with a standard three-prong receptacle;
a probe receiving portion including a plurality of openings formed in the main body portion for receiving and electrically interconnecting an electrical device; and
an AFCI circuit provided in the main body portion, said AFCI circuit providing ARC fault protection to an electrical device when plugged into an unprotected circuit.

22. The AFCI circuit module according to claim 21, further comprising: a GFCI test actuator provided on the main body portion, said GFCI test actuator being used in testing an operational capacity of a GFCI protected circuit.

23. The AFCI circuit module according to claim 21, wherein the probe receiving portion includes three openings formed in the main body portion, said three openings being adapted to receive a plurality of electrodes arranged in a standard three-prong receptacle configuration.

* * * * *